(12) United States Patent  (10) Patent No.: US 8,456,078 B2
Hashimoto  (45) Date of Patent: Jun. 4, 2013

(54) FLEXIBLE DISPLAY APPARATUS

(75) Inventor: Morimi Hashimoto, Wako (JP)

(73) Assignee: Canon Kabushiki Kaisha, Tokyo (JP)

( * ) Notice: Subject to any disclaimer, the term of this patent is extended or adjusted under 35 U.S.C. 154(b) by 414 days.

(21) Appl. No.: 12/017,436

(22) Filed: Jan. 22, 2008

(65) Prior Publication Data

US 2008/0182109 A1 Jul. 31, 2008

(30) Foreign Application Priority Data

Jan. 31, 2007 (JP) ................................. 2007-020335

(51) Int. Cl.
*H05B 33/02* (2006.01)

(52) U.S. Cl.
USPC .......................................... 313/504; 313/512

(58) Field of Classification Search
USPC .................. 313/498–512; 315/169.3; 345/36, 345/45, 76
See application file for complete search history.

(56) References Cited

U.S. PATENT DOCUMENTS

| 2003/0034497 A1* | 2/2003 | Yamazaki et al. ............... 257/86 |
| 2004/0012747 A1* | 1/2004 | Yamazaki et al. ............. 349/153 |
| 2004/0180476 A1* | 9/2004 | Kazlas et al. ................ 438/146 |
| 2005/0123243 A1* | 6/2005 | Steckl et al. .................... 385/40 |
| 2006/0007368 A1 | 1/2006 | Slikkerveer et al. |
| 2006/0134400 A1* | 6/2006 | Takada et al. .............. 428/313.9 |
| 2007/0085477 A1* | 4/2007 | Kubota ......................... 313/512 |

FOREIGN PATENT DOCUMENTS

| JP | 62-103998 | | 5/1987 |
| JP | 7-282980 | | 10/1995 |
| JP | 2000-12213 | | 1/2000 |
| JP | 2002-015858 | A | 1/2002 |
| JP | 2004-79432 | | 3/2004 |
| JP | 2004-281086 | | 10/2004 |
| JP | 2005-19082 | | 1/2005 |
| JP | 2005-055637 | A | 3/2005 |
| JP | 2006-24530 | | 1/2006 |
| JP | 2006-507543 | A | 3/2006 |
| JP | 2006-193596 | A | 7/2006 |
| JP | 2006-294536 | A | 10/2006 |

* cited by examiner

*Primary Examiner* — Nimeshkumar Patel
*Assistant Examiner* — Christopher Raabe
(74) *Attorney, Agent, or Firm* — Fitzpatrick, Cella, Harper & Scinto

(57) ABSTRACT

A flexible display apparatus includes a flexible base film, and a light emitting device formed on the base film. A surface located on a light emitting surface side has a hardness higher than a hardness of a surface located on a rear surface side.

17 Claims, 3 Drawing Sheets

FLEXIBLE DISPLAY APPARATUS

BACKGROUND OF THE INVENTION

1. Field of the Invention

The present invention relates to a flexible display apparatus (hereinafter, also simply referred to as a display apparatus) which is thin, light in weight, and large in screen size. In particular, the present invention relates to a display apparatus which can be rolled up or bent (folded) to be stored.

2. Description of the Related Art

Currently, the demands for thin display apparatuses represented by a liquid crystal display (LCD) and an organic electroluminescence (EL) display has been rapidly increasing. However, further reductions in thickness and weight have been required in the market. It is desired to realize a flexible display apparatus in the near future. The flexible display apparatus has a large screen, but is thin and light in weight, so the apparatus can be rolled up or bent. Therefore, the flexible display apparatus can be easily held and carried. However, in the flexible display apparatus, there arise problems involving dropping or impact while being carried and friction or wearing between contact surfaces thereof while being rolled up or bent for storage, which do not occur in the conventional display apparatuses.

Conventionally, a glass base film is used for the display apparatus such as the LCD and the organic EL display. The flexible display apparatus requires reductions in thickness and weight, an increase in screen size, improvements in impact resistance characteristic and flexible characteristic, so a base film material thereof has been mainly reviewed.

When the glass base film is used, reinforcing a conventional glass material to reduce a thickness thereof has been studied (see Japanese Patent Application Laid-Open No. 2005-019082).

Also, employing one of a polymer film and a metal thin film instead of the glass base film has been studied (see Japanese Patent Application Laid-Open Nos. 2000-012213, 2004-281086, S62-103998 and H07-282980).

Further, a base film in which the glass and the polymer film are combined has been studied (see Japanese Patent Application Laid-Open Nos. 2004-079432 and 2006-024530).

However, even when the glass base film is thinned, there is a problem with respect to the impact resistance characteristic. In addition, it is impossible to bend the glass base film without being broken up to a level to which the glass base film is rolled up (with a diameter of, for example, 100 mm) to be stored.

When one of the polymer film and the metal thin film is used as the base film, there is no problem with respect to reductions in thickness and weight, an increase in screen size, an improvement in flexible characteristic, and the like. However, the inventor of the present invention found that, when a light emitting surface is brought into contact with an opposed surface while the base film is being rolled up or bent to be stored, there arises a problem in the light emitting surface because the light emitting surface is easily damaged.

SUMMARY OF THE INVENTION

An object of the present invention is to provide a flexible display apparatus in which a surface located on a light emitting surface side can be prevented from damage caused by contact between the surface located on the light emitting surface side and a surface located on a rear surface side while the flexible display apparatus is rolled up in any size to be stored, thereby easily being stored in a small size.

In order to solve the above-mentioned problems in the related art, a flexible display apparatus according to the present invention, which is to be rolled up so that a surface located on a light emitting surface side of the flexible display apparatus is brought into contact with a surface located on a rear surface side thereof at a time of storage, includes: a flexible base film; and a light emitting device formed on the base film, in which the surface located on the light emitting surface side has a hardness higher than a hardness of the surface located on the rear surface side.

According to the flexible display apparatus of the present invention, the hardness of the surface located on the light emitting surface side is made higher than the hardness of the surface located on the rear surface side. Therefore, while the display apparatus is rolled up or bent for storage, the surface located on the light emitting surface side can be almost prevented from the damage caused by contact between the surface located on the light emitting surface side and the surface located on the rear surface side. Accordingly, the display apparatus having a large size can be easily stored in a small size.

A method of making the hardness of the surface located on the light emitting surface side higher than the hardness of the surface located on the rear surface side in the display apparatus can be realized by only employing a member having a higher hardness (such as Young's modulus, light weight tear strength, and Vickers hardness) than a member located on the rear surface side as a polymer film located on the light emitting surface side. Therefore, special materials, steps, and systems are unnecessary, so a significant increase in panel cost is avoided.

Further features of the present invention will become apparent from the following description of exemplary embodiments with reference to the attached drawings.

DESCRIPTION OF THE EMBODIMENTS

The present invention is obtained as a result of concentrated studies in view of the above-mentioned problems and designed to prevent a surface located on a light emitting surface side from being damaged by friction between the surface located on the light emitting surface side and a surface located on a rear surface side while the flexible display apparatus is rolled up or bent for storage.

That is, according to the display apparatus of the present invention, the problems have been overcome by making the hardness of the surface located on the light emitting surface side higher than the hardness of the surface located on the rear surface side. When the display apparatus is rolled up by bending, the surface located on the light emitting surface side of the display apparatus is brought into contact with the surface located on the rear surface thereof. At this time, the surface located on the light emitting surface side is hard and the surface located on the rear surface is soft, so a pressure or friction at the time of contact is reduced by damage to the soft surface (surface located on the rear surface). Even when dust exists between contact surfaces, the hard surface (surface located on the light emitting surface side) is not damaged because of the presence of the soft surface. A roughness of the soft surface is increased to reduce a friction coefficient, thereby preventing the hard surface from being damaged.

Hereinafter, the present invention will be specifically described with reference to FIG. 1.

Figure 1:
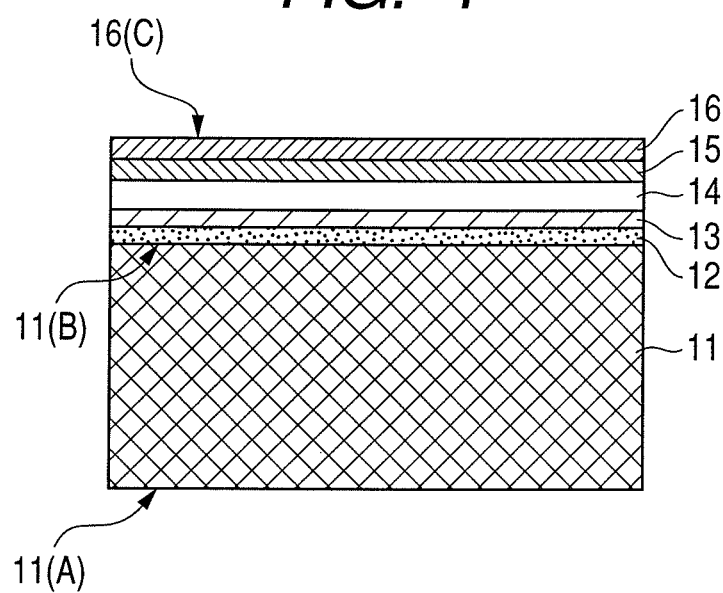
FIG. 1 is an explanatory view illustrating a fundamental structure of a flexible display apparatus according to the present invention.

A display apparatus illustrated in FIG. 1 has a structure in which an organic EL device is used as a light emitting device. A base film 11 is one of a transparent polymer film, a metal film (metal foil), and a lamination thereof. Examples of the polymer film which can be used include polyethylene naphthalate (PEN), polyethylene terephthalate (PET), polycarbonate (PC), polyimide (PI), and polyether sulfone (PES). Examples of the metal film which can be used include copper (Cu), aluminum (Al), stainless steel (SUS), nickel (Ni), cobalt (Co), iron (Fe), titanium (Ti), and an alloy thereof. In the case of the polymer film, in order to improve moisture permeability, a barrier layer which is one of an inorganic film, an organic film, and a laminate film thereof is generally formed on one or both surfaces of the polymer film. The barrier layer has a thin thickness equal to or smaller than several μm, so a hardness of the polymer film is dominant as "surface hardness".

An insulating layer 12, a first electrode 13, an organic layer (light emitting layer) 14, and a second electrode 15 are formed on the base film 11 in the stated order. A protective layer 16 including a sealing layer is further formed as an uppermost layer.

The protective layer 16 serves to protect the light emitting layer 14 from the outside world and is one of an inorganic film, an organic polymer film, and a laminate film thereof. A silicon compound film (such as SiN film and SiOC film) is used as the inorganic film. A heat curable resin film is used as the organic polymer film. The polymer film can be bonded onto the protective layer 16. The polymer film can be bonded as the protective layer 16 onto the light emitting layer 14. In the case of the polymer film, as described above, in order to improve moisture permeability, the barrier layer which is one of the inorganic film, the organic film, and the laminate film thereof is generally formed on one or both surfaces of the polymer film. However, a structure of the protective layer 16 is not particularly limited.

When the organic EL device having the structure of FIG. 1 is of a top emission type (type in which light is emitted to an opposite side to the base film 11), a lower surface 11(A) of the base film 11 is referred to as a surface located on a rear surface of the display apparatus according to the present invention and an upper surface 16(C) of the protective layer 16 is referred to as a surface located on a light emitting surface side thereof. When the organic EL device having the structure of FIG. 1 is of a bottom emission type (type in which light is emitted to the base film 11 side), the lower surface 11(A) of the base film 11 is referred to as the surface located on the light emitting surface side and the upper surface 16(C) of the protective layer 16 is referred to as the surface located on the rear surface.

In other words, in this embodiment, a mechanical hardness is unbalanced between a lower surface 11(B) of the base film 11 and the upper surface 16(C) of the protective layer 16. When a hardness of the surface located on the rear surface is expressed by H(B) and a hardness of the surface located on the light emitting surface side is expressed by H(F), a relationship of H(B)<H(F) is set. In addition, H(B) and H(F) are set in a range to satisfy desirably $1.1 < H(F)/H(B) \leq 10$, more desirably $1.6 \leq H(F)/H(B) \leq 3.5$. A contact surface stress is absorbed by the surface located on the rear surface, so the surface located on the light emitting surface side can be prevented from being damaged.

The "hardnesses" of the base film 11 and the protective layer 16 are compared with each other based on a magnitude relationship of any one of "Vickers hardness", "light weight tear strength", and "Young's modulus" at the same thickness. The "Young's modulus" and "light weight tear strength" of the polymer film to be used can be set based on catalog values. The "Vickers hardness" can be measured by a method defined in JIS Z 2244 "Vickers hardness test" and is within a range of approximately 10 to 400.

With respect to a roughness of the surface located on the rear surface, an arithmetic mean roughness Ra (hereinafter, arithmetic mean roughness is referred to as Ra) is set to satisfy $Ra \geq 1.5$ nm, so a friction coefficient between contact surfaces can be reduced to effectively prevent the surface located on the light emitting surface side from being damaged. In addition, wearing caused by friction proceeds on only the surface which is located on the rear surface and is soft and rough, so the surface located on the light emitting surface side can be prevented from being damaged.

Other constituent materials for the display apparatus illustrated in FIG. 1 will be specifically described.

The insulating layer 12 is formed if necessary. It is desirable to use silicon oxide ($SiO_2$), silicon nitride (SiN), aluminum nitride (AlN), aluminum oxide ($Al_2O_3$), or an organic polymer material.

ITO, IZO, and Al are selectively used for the first electrode 13 and the second electrode 15 if necessary.

The organic layer 14 includes, for example, a hole injecting layer, the light emitting layer, and an electron injecting layer, which are stacked in the stated order.

Although not illustrated, a barrier (bank) for pixel isolation, a planarization film, a color filter, and a circular polarizing plate may be stacked if necessary.

The flexible display apparatus according to the present invention has been described above. The present invention is not limited to the above-mentioned structure. For example, a so-called bottom emission display apparatus in which emitted light is extracted from the base film 11 side may be used. A so-called top emission display apparatus in which emitted light is extracted from the opposite side to the base film 11 may be used. The display apparatus according to the present invention is desirably a passive matrix type display apparatus in which light emitting devices are formed at intersections of stripe-shaped electrodes. The display apparatus according to the present invention may be an active matrix type display apparatus in which switching devices are formed on the base film 11 corresponding to respective light emitting devices. An electrode located on the base film 11 side may be any of the cathode and the anode.

The flexible display apparatus according to the present invention can be used for display portions of various electronic devices such as a television receiver, a digital camera, a personal digital assistant (PDA), a portable music player, a mobile telephone, and a car navigation system.

Hereinafter, the present invention will be specifically described with reference to examples. However, the present invention is not limited to the examples.

Example 1

Figure 2:
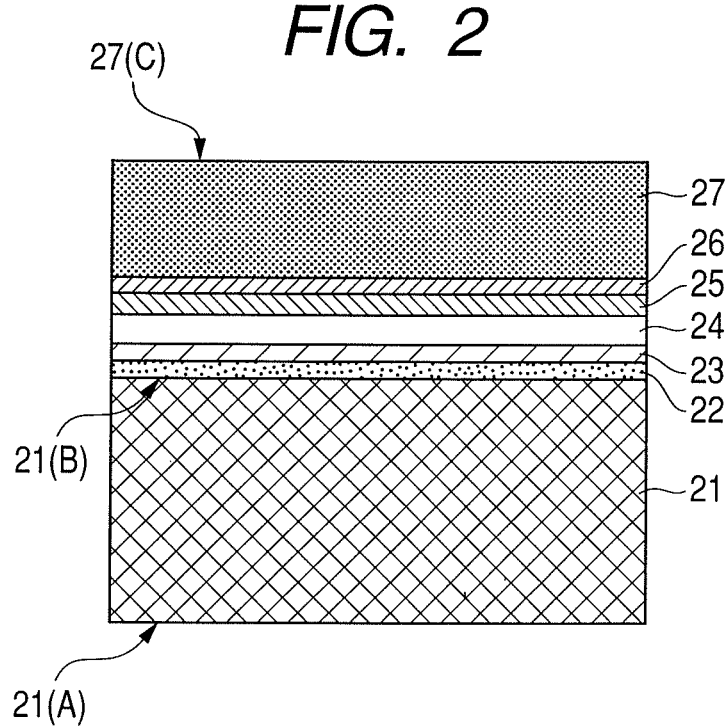
FIG. 2 is an explanatory view illustrating a flexible display apparatus (Examples 1 and 2) according to the present invention.

FIG. 2 illustrates a structure of a flexible display apparatus according to a first example of the present invention.

A base film 21 was a PES film (approximately 30 inches in diagonal size). A barrier layer which is a laminate of silicon nitride (SiN) thin films was formed on both surfaces of the base film 21 at a thickness of 0.5 µm.

A thickness of the PES film (hereinafter, also expressed by the same reference numeral 21 as that of the base film) 21 was 100 µm including a thickness of each of the barrier layers. A Young's modulus of the PES film 21 was 2,300 MPa and a light weight tear strength thereof was 2.0 MPa. A Vickers hardness of a lower surface 21(A) of the PES film 21 was 150. A surface roughness Ra of the lower surface 21(A) of the PES film 21 was 1.5 nm and a surface roughness Ra of an upper surface 21(B) thereof was 0.6 nm.

An $SiO_2$ film was formed as an insulating layer 22 on the PES film 21 at a thickness of 500 nm by sputtering. A Cr thin film was formed as a first electrode 23 on the insulating layer 22 at a thickness of 100 nm by sputtering. A hole injecting layer, a light emitting layer, and an electron injecting layer, each of which has a thickness of approximately 60 nm, were formed as an organic layer 24 on the first electrode 23 in the stated order by application using a spin coater. An ITO film was formed as a second electrode 25 on the organic layer 24 at a thickness of 150 nm by sputtering. Silicon nitride (SiN) thin films were stacked as an inorganic sealing layer 26 on the second electrode 25 at a total thickness of 4 µm by a CVD method. A PEN film 27 was bonded onto the inorganic sealing layer 26.

A barrier layer including silicon nitride (SiN) thin films was formed on both surfaces of the PEN film 27 at a thickness of 0.5 µm. A thickness of the PEN film 27 was 50 µm including a thickness of each of the barrier layers. A Young's modulus of the PEN film 27 was 6,100 MPa and a light weight tear strength thereof was 6.0 MPa. A Vickers hardness of an upper surface 27(C) of the PEN film 27 was 350. The upper surface 27(C) of the PEN film 27 may be any of opposed surfaces thereof. In this example, the upper surface 27(C) was a surface whose surface roughness is large. A surface roughness Ra of the upper surface 27(C) was 2.0 nm.

The display apparatus manufactured in this example was of the top emission type, so the surface located on the light emitting surface side was the upper surface 27(C) of the PEN film 27 and the surface located on the rear surface side was the lower surface 21(A) of the PES film 21. Mechanical characteristics of the PEN film 27 located on the light emitting surface side were compared with mechanical characteristics of the PES film 21 located on the rear surface side. As a result, the Young's modulus of the PEN film 27 located on the light emitting surface side was approximately 2.7 times the Young's modulus of the PES film 21 located on the rear surface side, the light weight tear strength was approximately 3.0 times, and the Vickers hardness was approximately 2.3 times.

Taking advantage of the flexibility of the display apparatus, the display apparatus was rolled up in a cylindrical shape with a diameter of approximately 10 cm while the surface 27(C) located on the light emitting surface side faced the inside. Then, the display apparatus was spread to return to an original shape. This action was repeated 1,000 times. As a result, the surface 21(A) located on the rear surface side was much damaged. In contrast to this, the surface 27(C) located on the light emitting surface side got no damage. In other words, when the hardness of the PEN film 27 located on the light emitting surface side was set to a value which is 2.3 times to 3.0 times the hardness of the PES film 21 located on the rear surface side, the surface 27(C) located on the light emitting surface side could be completely prevented from being damaged.

Further, the surface 27(C) located on the light emitting surface side was not influenced by the damage to the surface 21(A) located on the rear surface side.

Example 2

Example 2 was identical to Example 1 except for that a PC film was used instead of the PES film located on the rear surface. This example will be described with reference to FIG. 2.

A barrier layer which is a laminate of silicon nitride (SiN) thin films was formed on both surfaces of the PC film (approximately 30 inches in diagonal size) of the base film 21 at a thickness of 0.5 µm.

A thickness of the PC film (hereinafter, also expressed by the same reference numeral 21 as that of the base film) 21 was 125 µm including a thickness of each of the barrier layers. A Young's modulus of the PC film 21 was 1,800 MPa and a light weight tear strength thereof was 1.8 MPa. A Vickers hardness of a lower surface 21(A) of the PC film 21 was 100. A surface roughness Ra of the lower surface 21(A) of the PC film 21 was 3.5 nm and a surface roughness Ra of an upper surface 21(B) thereof was 0.8 nm.

The display apparatus manufactured in this example was of the top emission type as in Example 1. Mechanical characteristics of the PEN film 27 located on the light emitting surface side were compared with mechanical characteristics of the PC film 21 located on the rear surface side. As a result, the Young's modulus of the PEN film 27 located on the light emitting surface side was approximately 3.4 times the Young's modulus of the PC film 21 located on the rear surface side, the light weight tear strength was approximately 3.3 times, and the Vickers hardness was approximately 3.5 times.

Taking advantage of the flexibility of the display apparatus, the display apparatus was rolled up in a cylindrical shape with a diameter of approximately 10 cm while the surface 27(C) located on the light emitting surface side faced the inside. Then, the display apparatus was spread to return to an original shape. This action was repeated 1,000 times. As a result, the surface 21(A) located on the rear surface side was much damaged. In contrast to this, the surface 27(C) located on the light emitting surface side got no damage. In other words, when the hardness of the PEN film 27 located on the light emitting surface side was set to a value which is 3.3 times to 3.5 times the hardness of the PC film 21 located on the rear surface side, the surface 27(C) located on the light emitting surface side could be completely prevented from being damaged.

Further, the surface 27(C) located on the light emitting surface side was not influenced by the damage to the surface 21(A) located on the rear surface side. As compared with Example 1, the number of damages on the surface 21(A) located on the rear surface side was small. This is because, the PC film was softer than the PES film, so an impact at the time of surface contact was further reduced thereby. In addition to this, the surface roughness of the lower surface of the PC film was increased, so a friction coefficient became smaller to make the surface resistant to damage.

Example 3

Figure 3:
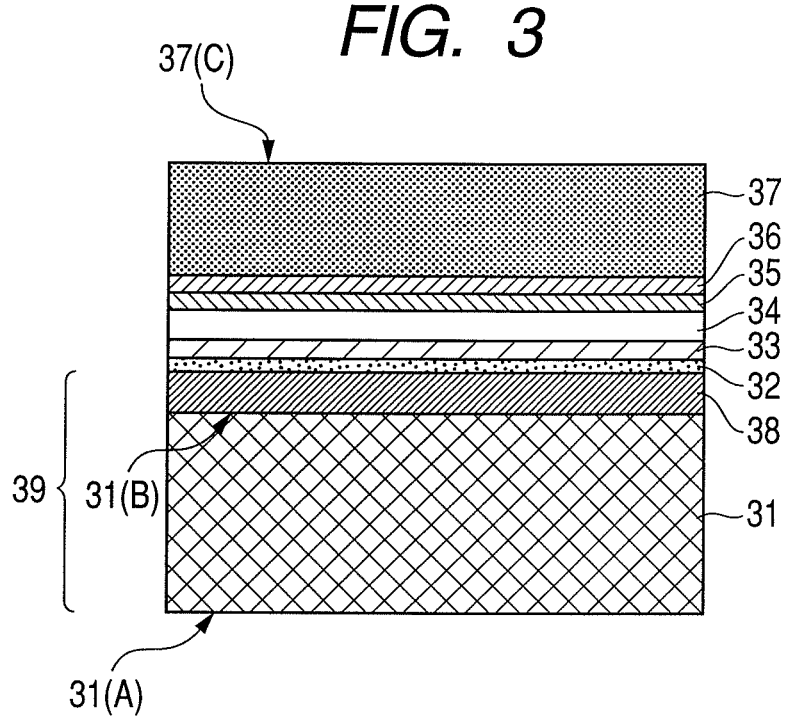
FIG. 3 is an explanatory view illustrating a flexible display apparatus (Example 3 and Comparative Example 2) according to the present invention.

FIG. 3 illustrates a structure of a flexible apparatus according to a third example of the present invention.

A base film 31 was a PC film (approximately 30 inches in diagonal size). Barrier layers were not formed. A thickness of the PC film (hereinafter, also expressed by the same reference numeral 31 as that of the base film) 31 was 100 μm. A Young's modulus of the PC film 31 was 1,800 MPa and a light weight tear strength thereof was 1.8 MPa. A Vickers hardness of a lower surface 31(A) of the PC film 31 was 100. A surface roughness Ra of the lower surface 31(A) of the PC film 31 was 3.0 nm and a surface roughness Ra of an upper surface 31(B) thereof was 0.5 nm. A metal film 38 (10 μm in thickness) of SUS was formed on the PC film 31 by plating to construct a laminated composite base film 39 in which the PC film 31 and the metal film 38 were stacked.

An $SiO_2$ film was formed as an insulating layer 32 on the base film 39 at a thickness of 500 nm by sputtering. A Cr thin film was formed as a first electrode 33 on the insulating layer 32 at a thickness of 100 nm by sputtering. A hole injecting layer, a light emitting layer, and an electron injecting layer, each of which has a thickness of approximately 60 nm, were formed as an organic layer 34 on the first electrode 33 in the stated order by application using a spin coater. An ITO film was formed as a second electrode 35 on the organic layer 34 at a thickness of 150 nm by sputtering. Silicon nitride (SiN) thin films were stacked as an inorganic sealing layer 36 on the second electrode 35 at a total thickness of 4 μm by the CVD method. A PEN film 37 was bonded onto the inorganic sealing layer 36.

Each of the barrier layers including silicon nitride (SiN) thin films was formed on both surfaces of the PEN film 37 at a thickness of 0.5 μm. A thickness of the PEN film 37 was 50 μm including a thickness of each of the barrier layers. A Young's modulus of the PEN film 37 was 6,100 MPa and a light weight tear strength thereof was 6.0 MPa. A Vickers hardness of an upper surface 37(C) of the PEN film 37 was 350. A surface roughness Ra of the upper surface 37(C) of the PEN film 37 was 2.0 nm.

The display apparatus manufactured in this example was of the top emission type, so the surface located on the light emitting surface side was the upper surface 37(C) of the PEN film 37 and the surface located on the rear surface side was the lower surface 31(A) of the PC film 31. Mechanical characteristics of the PEN film 37 located on the light emitting surface side were compared with mechanical characteristics of the PC film 31 located on the rear surface side. As a result, the Young's modulus of the PEN film 37 located on the light emitting surface side was approximately 3.4 times the Young's modulus of the PC film 31 located on the rear surface side, the light weight tear strength was approximately 3.3 times, and the Vickers hardness was approximately 3.5 times.

Taking advantage of the flexibility of the display apparatus, the display apparatus was rolled up in a cylindrical shape with a diameter of approximately 10 cm while the surface 37(C) located on the light emitting surface side faced the inside. Then, the display apparatus was spread to return to an original shape. This action was repeated 1,000 times. As a result, the surface 31(A) located on the rear surface side was much damaged. In contrast to this, the surface 37(C) located on the light emitting surface side got no damage. In other words, when the hardness of the PEN film 37 located on the light emitting surface side was set to a value which is 3.3 times to 3.5 times the hardness of the PC film 31 located on the rear surface side, the surface located on the light emitting surface side could be completely prevented from being damaged.

Further, the surface 37(C) located on the light emitting surface side was not influenced by the damage to the surface 31(A) located on the rear surface side. Because of the presence of the metal film 38, a temperature was not almost increased while power is being applied to the display apparatus.

The composite base film including the PC film 31 and the metal film 38 was used, so a display apparatus having both flexibility and a heat radiation effect could be provided.

Example 4

Figure 4:
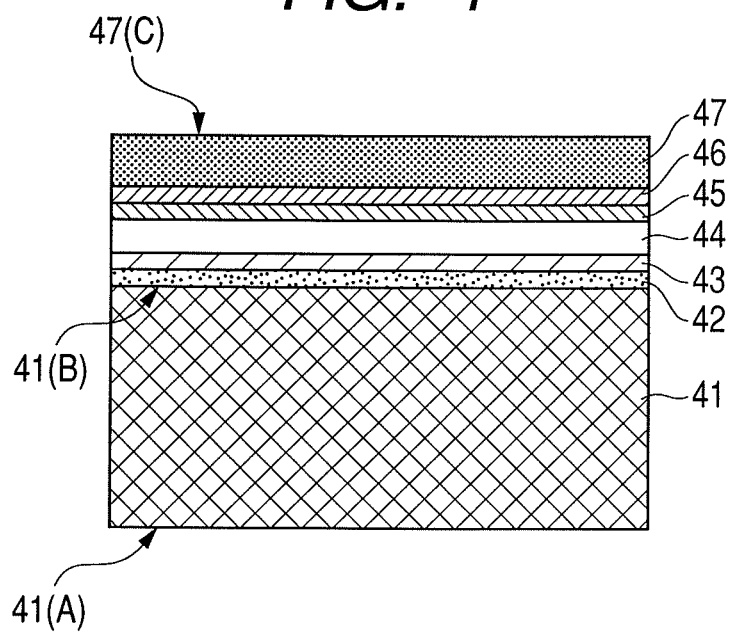
FIG. 4 is an explanatory view illustrating a flexible display apparatus (Example 4) according to the present invention.

FIG. 4 illustrates a structure of a flexible apparatus according to a fourth example of the present invention.

A base film 41 was a PEN film (approximately 30 inches in diagonal size). A barrier layer which is a laminate of silicon nitride (SiN) thin films was formed on both surfaces of the base film 41 at a thickness of 0.5 μm.

A thickness of the PEN film (hereinafter, also expressed by the same reference numeral 41 as that of the base film) 41 was 100 μm including a thickness of each of the barrier layers. A Young's modulus of the PEN film 41 was 6,100 MPa and a light weight tear strength thereof was 6.0 MPa. A Vickers hardness of a lower surface 41(A) of the PEN film 41 was 350. A surface roughness Ra of the lower surface 41(A) of the PEN film 41 was 2.0 nm and a surface roughness Ra of an upper surface 41(B) thereof was 0.5 nm.

An $SiO_2$ film was formed as an insulating layer 42 on the PEN film 41 at a thickness of 500 nm by sputtering. An ITO thin film was formed as a first electrode 43 on the insulating layer 42 at a thickness of 100 nm by sputtering. A hole injecting layer, a light emitting layer, and an electron injecting layer, each of which has a thickness of approximately 60 nm, were formed as an organic layer 44 on the first electrode 43 in the stated order by application using a spin coater. An Al film was formed as a second electrode 45 on the organic layer 44 at a thickness of 150 nm by sputtering. Silicon nitride (SiN) thin films were stacked as an inorganic sealing layer 46 on the second electrode 45 at a total thickness of 4 μm by the CVD method. A PI film 47 was bonded onto the inorganic sealing layer 46.

A barrier layer including silicon nitride (SiN) thin films was formed on both surfaces of the PI film 47 at a thickness of 0.5 μm. A thickness of the PI film 47 was 25 μm including a thickness of each of the barrier layers. A Young's modulus of the PI film 47 was 3,650 MPa and a light weight tear strength thereof was 3.8 MPa. A Vickers hardness of an upper surface 47(C) of the PI film 47 was 200. A surface roughness Ra of the upper surface 47(C) of the PI film 47 was 2.0 nm.

The display apparatus manufactured in this example was of the bottom emission type, so the surface located on the light emitting surface side was the lower surface 41(A) of the PEN film 41 and the surface located on the rear surface side was the upper surface 47(C) of the PI film 47. Mechanical characteristics of the PEN film 41 located on the light emitting surface side were compared with mechanical characteristics of the PI film 47 located on the rear surface side. As a result, the Young's modulus of the PEN film 41 located on the light emitting surface side was approximately 1.7 times the Young's modulus of the PI film 47 located on the rear surface side, the light weight tear strength was approximately 1.6 times, and the Vickers hardness was approximately 1.8 times.

Taking advantage of the flexibility of the display apparatus, the display apparatus was rolled up in a cylindrical shape with a diameter of approximately 10 cm while the surface 41(A) located on the light emitting surface side faced the inside. Then, the display apparatus was spread to return to an original shape. This action was repeated 1,000 times. As a result, the surface 47(C) located on the rear surface side was much damaged. In contrast to this, the surface 41(A) located on the light emitting surface side got no damage. In other words, when the hardness of the PEN film 41 located on the light emitting surface side was set to a value which is 1.6 times to 1.8 times the hardness of the PI film 47 located on the rear surface side, the surface 41(A) located on the light emitting surface side could be completely prevented from being damaged.

Further, the surface 41(A) located on the light emitting surface side was not influenced by the damage to the surface 47(C) located on the rear surface side.

Example 5

Figure 5:
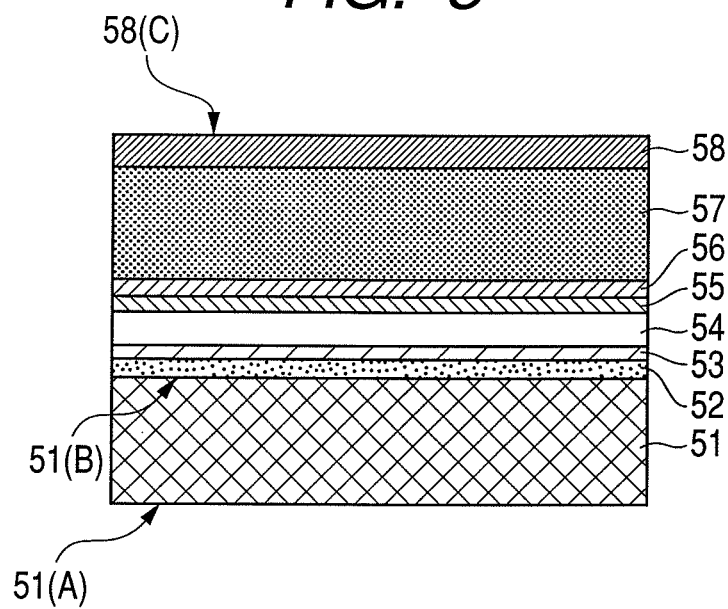
FIG. 5 is an explanatory view illustrating a flexible display apparatus (Example 5 and Comparative Example 1) according to the present invention.

FIG. 5 illustrates a structure of a flexible apparatus according to a fifth example of the present invention.

A base film 51 was a PEN film (approximately 30 inches in diagonal size). A barrier layer which is a laminate of silicon nitride (SiN) thin films was formed on both surfaces of the base film 51 at a thickness of 6.0 μm.

A thickness of the PEN film (hereinafter, also expressed by the same reference numeral 51 as that of the base film) 51 was 50 μm including a thickness of each of the barrier layers. A Young's modulus of the PEN film 51 was 6,100 MPa and a light weight tear strength thereof was 6.0 MPa. A Vickers hardness of a lower surface 51(A) of the PEN film 51 was 350. A surface roughness Ra of the lower surface 51(A) of the PEN film 51 was 2.0 nm and a surface roughness Ra of an upper surface 51(B) thereof was 0.5 nm.

An $SiO_2$ film was formed as an insulating layer 52 on the PEN film 51 at a thickness of 500 nm by sputtering. An ITO thin film was formed as a first electrode 53 on the insulating layer 52 at a thickness of 100 nm by sputtering. A hole injecting layer, a light emitting layer, and an electron injecting layer, each of which has a thickness of approximately 60 nm, were formed as an organic layer 54 on the first electrode 53 in the stated order by application using a dispenser. An Al film was formed as a second electrode 55 on the organic layer 54 at a thickness of 150 nm by sputtering. Silicon nitride (SiN) thin films were stacked as an inorganic sealing layer 56 on the second electrode 55 at a total thickness of 6 μm by the CVD method. A PEN film 57, which was the same as the PEN film 51 of the base film, was bonded onto the inorganic sealing layer 56.

A polyimide resin (precursor) was applied onto the PEN film 57 to form a polyimide resin layer 58 whose thickness was 3 μm. A Young's modulus of the polyimide resin layer 58 was 3,650 MPa and a light weight tear strength thereof was 3.8 MPa. A Vickers hardness of an upper surface 58(C) of the polyimide resin layer 58 was 200. A surface roughness Ra of the upper surface 58(C) of the polyimide resin layer 58 was 3.0 nm.

The display apparatus manufactured in this example was of the bottom emission type, so the surface located on the light emitting surface side was the lower surface 51(A) of the PEN film 51 and the surface located on the rear surface side was the upper surface 58(C) of the polyimide resin layer 58. Mechanical characteristics of the PEN film 51 located on the light emitting surface side were compared with mechanical characteristics of the polyimide resin layer 58 located on the rear surface side. As a result, the Young's modulus of the PEN film 51 located on the light emitting surface side was approximately 1.7 times the Young's modulus of the polyimide resin layer 58 located on the rear surface side, the light weight tear strength was approximately 1.6 times, and the Vickers hardness was approximately 1.8 times.

Taking advantage of the flexibility of the display apparatus, the display apparatus was rolled up in a cylindrical shape with a diameter of approximately 10 cm while the surface 51(A) located on the light emitting surface side faced the inside. Then, the display apparatus was spread to return to an original shape. This action was repeated 1,000 times. As a result, the surface 58(C) located on the rear surface side was much damaged. In contrast to this, the surface 51(A) located on the light emitting surface side got no damage. In other words, when the PEN film 57 located on the rear surface side was coated with the polyimide resin layer 58 which is soft, the effect of the present invention was obtained.

Further, the surface 51(A) located on the light emitting surface side was not influenced by the damage to the surface 58(C) located on the rear surface side.

In particular, the display apparatus includes the PEN films which are provided on the light emitting surface side and the rear surface side and have equal thicknesses, so the display apparatus whose curl is extremely small and flatness is excellent was completed.

Example 6

Figure 6:
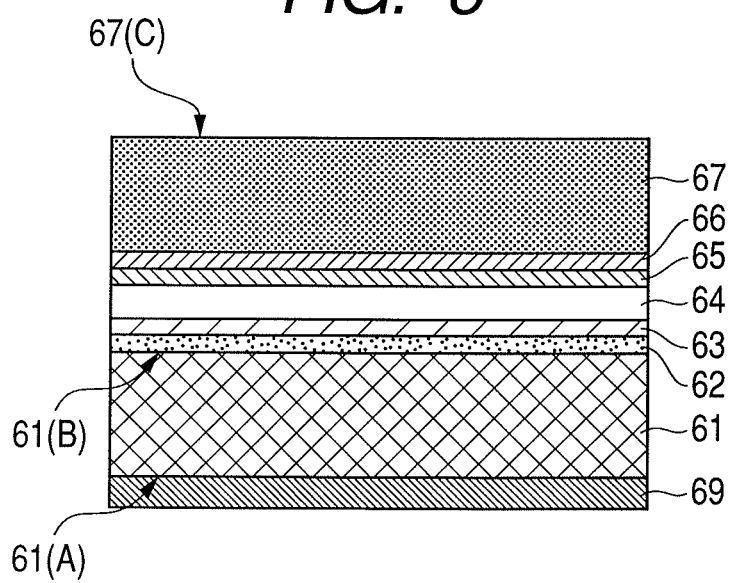
FIG. 6 is an explanatory view illustrating a flexible display apparatus (Example 6) according to the present invention.

FIG. 6 illustrates a structure of a flexible apparatus according to a sixth example of the present invention.

A base film 61 was a PES film (approximately 30 inches in diagonal size). A barrier layer which is a laminate of silicon nitride (SiN) thin films was formed on both surfaces of the base film 61 at a thickness of 6.0 μm.

A thickness of the PES film (hereinafter, also expressed by the same reference numeral 61 as that of the base film) 61 was 50 μm including a thickness of each of the barrier layers. A Young's modulus of the PES film 61 was 2,300 MPa and a light weight tear strength thereof was 2.0 MPa. A Vickers hardness of the PES film 61 was 150.

An organic EL device was formed on the PES film 61 in the same procedure as Example 5. A PES film 67 identical to the PES film 61 was bonded to the organic EL device. A surface roughness Ra of an upper surface 67(C) of the PES film 67 was 0.6 nm.

A heat curable epoxy resin layer 69 was formed by application on a lower surface 61(A) of the PES film 61 at a thickness of 3 μm. A Young's modulus of the epoxy resin layer 69 was 6,500 MPa, a light weight tear strength thereof was 6.2 MPa, and a Vickers hardness thereof was 400.

The display apparatus manufactured in this example was of the bottom emission type, so the surface located on the light emitting surface side was the lower surface of the epoxy resin layer 69 and the surface located on the rear surface side was the upper surface 67(C) of the PES film 67. Mechanical characteristics of the epoxy resin layer 69 located on the light emitting surface side were compared with mechanical characteristics of the PES film 67 located on the rear surface side. As a result, the Young's modulus of the epoxy resin layer 69 located on the light emitting surface side was approximately 2.8 times the Young's modulus of the PES film 67 located on the rear surface side, the light weight tear strength was approximately 3.1 times, and the Vickers hardness was approximately 2.7 times.

Taking advantage of the flexibility of the display apparatus, the display apparatus was rolled up in a cylindrical shape with a diameter of approximately 10 cm while the surface located on the light emitting surface side faced the inside. Then, the display apparatus was spread to return to an original shape. This action was repeated 1,000 times. As a result, the surface 67(C) located on the rear surface side was much damaged. In contrast to this, the surface located on the light emitting surface side got no damage. In other words, when the PES film 61 located on the light emitting surface side was coated with the epoxy resin layer 69 which is hard, the effect of the present invention was obtained.

Further, the surface located on the light emitting surface side was not influenced by the damage to the surface 67(C) located on the rear surface side.

In particular, the display apparatus includes the PES films which are provided on the light emitting surface side and the rear surface side and have equal thicknesses, so a panel whose curl is extremely small and flatness is excellent was completed.

Example 7

Example 7 was identical to Example 1 except for that the surface roughness Ra of the lower surface 21(A) of the PES film 21 was set to 0.6 nm and the surface roughness Ra of the upper surface 21(B) thereof was set to 0.6 nm. Mechanical characteristics of the display apparatus manufactured in this example were equal to the mechanical characteristics in Example 1.

Taking advantage of the flexibility of the display apparatus, the display apparatus was rolled up in a cylindrical shape with a diameter of approximately 10 cm while the surface 27(C) located on the light emitting surface side faced the inside. Then, the display apparatus was spread to return to an original shape. This action was repeated 500 times. As a result, the surface 21(A) located on the rear surface side was much damaged. In contrast to this, the surface 27(C) located on the light emitting surface side got no damage. The action was repeated 500 times again. As a result, the surface 27(C) located on the light emitting surface side was slightly damaged.

The display apparatus according to this example had slightly lower durability than the display apparatus according to Example 1. However, the durability was on a level that there is no problem in practical use.

Comparative Example 1

Comparative Example 1 was identical to Example 5 except for that the polyimide resin layer 58 was not formed on the PEN film 57.

That is, in the display apparatus according to this comparative example, the organic EL device was inserted between the PEN films which are provided on the light emitting surface side and the rear surface side and have equal thicknesses. Therefore, the mechanical characteristics of the PEN films located on the light emitting surface side and the rear surface side were equal to each other.

Taking advantage of the flexibility of the display apparatus manufactured in this comparative example, the display apparatus was rolled up in a cylindrical shape with a diameter of approximately 10 cm while the surface 51(A) located on the light emitting surface side faced the inside. Then, the display apparatus was spread to return to an original shape. This action was repeated 1,000 times. As a result, both of the surface 51(A) located on the light emitting surface side and the surface located on the rear surface side were equally much damaged. When the surface 51(A) located on the light emitting surface side was damaged, there was a problem in that the damage was conspicuous at the time of light emission.

Comparative Example 2

A structure of a flexible display apparatus according to this comparative example will be described with reference to FIG. 3.

The base film 31 was a PET film (approximately 30 inches in diagonal size). A barrier layer which is a laminate of silicon nitride (SiN) thin films was formed on the lower surface 31(A) thereof at a thickness of 6.0 µm.

A thickness of the PET film (hereinafter, also expressed by the same reference numeral 31 as that of the base film) 31 was 50 µm including a thickness of each of the barrier layers. A Young's modulus of the PET film 31 was 5,400 MPa and a light weight tear strength thereof was 7.3 MPa. A Vickers hardness of the lower surface 31(A) of the PET film 31 was 300. A surface roughness Ra of the lower surface 31(A) of the PET film 31 was 2.5 nm and a surface roughness Ra of the upper surface 31(B) thereof was 0.5 nm. The metal film 38 (10 µm in thickness) of SUS was formed on the PET film 31 by plating to construct the laminated composite base film 39 in which the PET film 31 and the metal film 38 are stacked.

An $SiO_2$ film was formed as an insulating layer 32 on the base film 39 at a thickness of 500 nm by sputtering. A Cr thin film was formed as a first electrode 33 on the insulating layer 32 at a thickness of 100 nm by sputtering. A hole injecting layer, a light emitting layer, and an electron injecting layer, each of which has a thickness of approximately 60 nm, were formed as an organic layer 34 on the first electrode 33 in the stated order by application using a spin coater. An ITO film was formed as a second electrode 35 on the organic layer 34 at a thickness of 150 nm by sputtering. Silicon nitride (SiN) thin films were stacked as an inorganic sealing layer 36 on the second electrode 35 at a total thickness of 6 µm by the CVD method. A PC film 37 was bonded onto the inorganic sealing layer 36.

A barrier layer including silicon nitride (SiN) thin films was formed on both surfaces of the PC film 37 at a thickness of 5.0 µm. A thickness of the PC film 37 was 50 µm including a thickness of each of the barrier layers. A Young's modulus of the PC film 37 was 1,800 MPa and a light weight tear strength thereof was 1.8 MPa. A Vickers hardness of an upper surface 37(C) of the PC film 37 was 100. A surface roughness Ra of the upper surface 37 (C) of the PC film 37 was 2.0 nm.

The display apparatus manufactured in this comparative example was of the top emission type, so the surface located on the light emitting surface side was the upper surface 37(C) of the PC film 37 and the surface located on the rear surface side was the lower surface 31(A) of the PET film 31. Mechanical characteristics of the PC film 37 located on the light emitting surface side were compared with mechanical characteristics of the PET film 31 located on the rear surface side. As a result, the Young's modulus of the PC film 37 located on the light emitting surface side was approximately 0.3 times the Young's modulus of the PET film 31 located on the rear surface side, the light weight tear strength was approximately 0.2 times, and the Vickers hardness was approximately 0.3 times.

Taking advantage of the flexibility of the display apparatus, the display apparatus was rolled up in a cylindrical shape with a diameter of approximately 10 cm while the surface 37(C) located on the light emitting surface side faced the inside. Then, the display apparatus was spread to return to an original shape. This action was repeated 1,000 times. As a result, the surface 37(C) located on the light emitting surface side was much damaged. When the surface 37(C) located on the light emitting surface side was damaged, there was a problem in that the damage was conspicuous at the time of light emission.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2007-020335, filed Jan. 31, 2007, which is hereby incorporated by reference herein in its entirety.

What is claimed is:

1. A flexible display apparatus, comprising:
a flexible base film;
a flexible light emitting device formed on the base film, the light emitting device including a first electrode layer, a second electrode layer, and a light emitting layer disposed between the first and second electrode layers;
a first outermost surface located on the light emitting device and forming a light emitting surface;
a second outermost surface located on the base film and forming a rear surface; and
an inorganic sealing layer including silicon nitride provided on the flexible light emitting device, and a polymer film provided on the inorganic sealing layer and forming the first outermost surface, with the polymer film being in contact with the inorganic sealing layer, wherein
the first outermost surface forming the light emitting surface has a hardness higher than a hardness of the second outermost surface forming the rear surface,
wherein a roughness of the second outermost surface is greater than a roughness of the first outermost surface.

2. A top-emission type flexible display to be rolled up so that a surface located on a light emitting surface side of the flexible display is brought into contact with a surface located on a rear surface side, comprising:
a flexible base film;
a flexible light emitting device formed on the base film;
a first outermost surface located on the light emitting device and forming a light emitting surface;
a second outermost surface located on the base film and forming a rear surface; and
an inorganic sealing layer including silicon nitride provided on the flexible light emitting device, and a polymer film provided on the inorganic sealing layer and forming the first outermost surface, with the polymer film being in contact with the inorganic sealing layer, wherein
the first outermost surface forming the light emitting surface has a hardness higher than a hardness of the second outermost surface forming the rear surface, and
a roughness of the second outermost surface is greater than a roughness of the first outermost surface.

3. The flexible display according to claim 2, wherein, when the hardness of the first outermost surface and the hardness of the second outermost surface are expressed by H1 and H2, respectively, a relationship of $1.6 \leqq H1/H2 \leqq 3.5$ is satisfied.

4. The flexible display according to claim 2, wherein the roughness of the second outermost surface relative to the roughness of the first outermost surface is set to satisfy an arithmetic mean roughness of $Ra \geqq 1.5$ nm.

5. A top-emission type flexible display apparatus, comprising:
a flexible base film; and
a flexible light emitting device formed on the base film;
a first outermost surface located on the light emitting device and forming a light emitting surface;
a second outermost surface located on the base film and forming a rear surface; and
an inorganic sealing layer including silicon nitride provided on the flexible light emitting device, and a polymer film provided on the inorganic sealing layer and forming the first outermost surface, with the polymer film being in contact with the inorganic sealing layer, wherein
the first outermost surface forming the light emitting surface has a hardness higher than a hardness of the second outermost surface forming the rear surface,
a roughness of the second outermost surface is greater than a roughness of the first outermost surface, and
the flexible display apparatus can be rolled up so that the surface located on the light emitting surface side is brought into contact with the surface located on the rear surface side.

6. The flexible display apparatus according to claim 5, wherein, when the hardness of the first outermost surface and the hardness of the second outermost surface are expressed by H1 and H2, respectively, a relationship of $1.6 \leqq H1/H2 \leqq 3.5$ is satisfied.

7. The flexible display apparatus according to claim 5, wherein the roughness of the second outermost surface relative to the roughness of the first outermost surface is set to satisfy an arithmetic mean roughness of $Ra \geqq 1.5$ nm.

8. A flexible display apparatus, comprising:
a flexible base film;
a flexible light emitting device formed on the base film, a first surface located outside of the light emitting device and forming a light emitting surface, and a second surface located outside of the base film and forming a rear surface; and
an inorganic sealing layer including silicon nitride provided on the flexible light emitting device and a polymer film provided on the inorganic sealing layer and forming the first surface, with the polymer film being in contact with the inorganic sealing layer, wherein
the first surface forming the light emitting surface has a hardness higher than a hardness of the second surface forming the rear surface,
wherein a roughness of the second surface is greater than a roughness of the first surface.

9. The flexible display apparatus according to claim 1, wherein the flexible base film includes a first exterior layer and a second exterior layer facing opposite to the first exterior layer, and the flexible base film can flex so that the second exterior layer faces the first exterior layer.

10. The flexible display apparatus according to claim 1, wherein the flexible base film can flex so that the first outermost surface faces the second outermost surface.

11. The flexible display apparatus according to claim 1, wherein the polymer film is a polyethulene naphthalate film.

12. The flexible display apparatus according to claim 1, wherein a barrier layer which is one of an inorganic film, an organic film, and a laminate film thereof is provided on one or both surfaces of the polymer film.

13. The flexible display apparatus according to claim 2, wherein a barrier layer which is one of an inorganic film, an organic film, and a laminate film thereof is provided on one or both surfaces of the polymer film.

14. The flexible display apparatus according to claim 5, wherein a barrier layer which is one of an inorganic film, an organic film, and a laminate film thereof is provided on one or both surfaces of the polymer film.

15. The flexible display apparatus according to claim 8, wherein a barrier layer which is one of an inorganic film, an organic film, and a laminate film thereof is provided on one or both surfaces of the polymer film.

16. The flexible display according to claim 1, wherein the roughness of the second outermost surface relative to the roughness of the first outermost surface is set to satisfy an arithmetic mean roughness of $Ra \geqq 1.5$ nm.

17. The flexible display according to claim 8, wherein the roughness of the second outermost surface relative to the roughness of the first outermost surface is set to satisfy an arithmetic mean roughness of Ra≧1.5 nm.

* * * * *